US006977199B2

(12) United States Patent
Kishida et al.

(10) Patent No.: US 6,977,199 B2
(45) Date of Patent: Dec. 20, 2005

(54) METHOD OF FABRICATING SEMICONDUCTOR DEVICE

(75) Inventors: Takeshi Kishida, Hyogo (JP); Yusuke Kawase, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 3 days.

(21) Appl. No.: 10/900,151

(22) Filed: Jul. 28, 2004

(65) Prior Publication Data

US 2005/0032305 A1 Feb. 10, 2005

(30) Foreign Application Priority Data

Aug. 8, 2003 (JP) ............................ 2003-290204

(51) Int. Cl.[7] .......................................... H01L 21/8242
(52) U.S. Cl. ...................... 438/253; 438/255; 438/398
(58) Field of Search ............................... 438/253–256, 438/396–399

(56) References Cited

U.S. PATENT DOCUMENTS 6,399,440 B1 * 6/2002 Miao .......................... 438/255

FOREIGN PATENT DOCUMENTS

| | | |
|---|---|---|
| JP | 2000-91542 | 3/2000 |
| JP | 2001-203334 | 7/2001 |
| JP | 2002-190582 | 7/2002 |

* cited by examiner

*Primary Examiner*—H. Jey Tsai
(74) *Attorney, Agent, or Firm*—McDermott Will & Emery LLP

(57) ABSTRACT

On a silicon oxide film including the interior of an opening a semispherical RGP film is deposited. At a temperature lower than that allowing a crystal of silicon to be grown a BPTEOS film is deposited to fill the opening. Then a portion other than the semispherical RGP film introduced in the opening is chemically mechanically polished and thus removed. This contributes to reduced crystal growth of silicon at the semispherical RGP film and hence reduced scattering and/or removal of the RGP film for example when a CMP step is performed. Subsequently the semispherical RGP film is annealed to grow a crystal of silicon to form a generally spherical RGP film. Thus a storage node can have an increased surface area and a capacitor can have increased capacity.

16 Claims, 11 Drawing Sheets

METHOD OF FABRICATING SEMICONDUCTOR DEVICE

BACKGROUND OF THE INVENTION

1. Field of the Invention

The present invention relates generally to methods of fabricating semiconductor devices and particularly to methods of fabricating semiconductor devices with a capacitor.

To store information, semiconductor devices are used. One such device is dynamic random access memory (DRAM). To allow a DRAM to steadily store an electric charge serving as information as a design rule is reduced, a variety of approaches has been proposed to ensure that its capacitor has sufficient capacity.

2. Description of the Background Art

To ensure that a capacitor has sufficient capacity, Japanese Patent Laying-Open No. 2001-203334 proposes to provide a surface of an electrode (a storage node) of a capacitor with protrusions and depressions to allow the storage node and a capacitor insulation film to contact each other over an increased area.

The publication describes a method of fabricating a semiconductor device, as will be described hereinafter. Initially, a memory cell transistor or the like formed on a semiconductor substrate is covered with an interlayer insulation film for example of silicon oxide film. The interlayer insulation film is provided with a contact hole exposing the memory cell transistor.

Subsequently a doped polysilicon film is deposited on the interlayer insulation film to fill the contact hole. The doped polysilicon film has a surface entirely etched back to remove the doped polysilicon film from an upper surface of the interlayer insulation film while allowing the doped polysilicon film to remain in the contact hole. A bottom electrode plug is thus provided in the contact hole.

Subsequently a silicon nitride film is deposited on the interlayer insulation film as an etching stopper to cover the bottom electrode plug. On the silicon nitride film a silicon oxide film is deposited for providing a storage node.

Subsequently a prescribed resist pattern is formed on the silicon oxide film. The resist pattern is used as a mask to etch the silicon oxide film to form an opening exposing a surface of the bottom electrode plug.

Subsequently a doped polysilicon film and an amorphous silicon film are deposited on the silicon oxide film including the interior of the opening. Then the amorphous silicon film is roughened as prescribed to provide a rugged grain polysilicon (RGP) film.

Subsequently an insulation film is deposited on the RGP film to fill the opening. The insulation film is chemically mechanically polished to remove the RGP film and the doped polysilicon film from the silicon oxide film while the RGP film remains in the opening. Electrical isolation from an adjacent storage node is thus achieved.

Subsequently the insulation film on the RGP film is removed and furthermore the silicon oxide film surrounding the RGP film is removed. A storage node by the RGP film is thus exposed.

Subsequently a capacitor insulation film is deposited to cover the RGP film. On the capacitor insulation film a titanium nitride (TiN) film and a polysilicon film are deposited to serve as a cell plate. A capacitor including the storage node, the capacitor insulation film and the cell plate is thus provided.

Thereafter another interlayer insulation film is deposited to cover the capacitor and furthermore on the interlayer insulation film a prescribed interconnect layer is deposited to complete a main portion of the DRAM.

The above described, conventional method of fabricating a DRAM, however, has the following disadvantage: in the conventional method in forming the storage node the storage node is isolated after a roughening step is performed to prevent short circuit between adjacent storage nodes. In other words, the insulation film introduced into the opening is CMPed after the amorphous silicon film is roughened as prescribed.

After the amorphous silicon film is roughened and before the capacitor insulation film is deposited, a semiconductor substrate is CMPed, etched, and the like, and such steps may disadvantageously remove the RGP film. Consequently, the capacitor may have insufficient capacity.

SUMMARY OF THE INVENTION

The present invention has been made to overcome the above disadvantage and it contemplates a method of fabricating a semiconductor device that provides reduced removal of a layer serving as an electrode of a capacitor.

The present method includes the steps of: depositing a first insulation film of a prescribed thickness on a main surface of a semiconductor substrate; providing the first insulation film with an opening to expose a main surface of the semiconductor substrate; depositing an amorphous silicon film on a surface of the first insulation film including the opening's bottom and side surfaces; at least forming a silicon nucleus on a surface of the amorphous silicon film to grow silicon to form a layer to serve as an electrode; depositing a second insulation film on the layer to serve as the electrode to fill the opening; removing the layer to serve as the electrode and the second insulation film from an upper surface of the first insulation film to electrically isolate the layer to serve as the electrode; removing the first and second insulation films to expose the layer to serve as the electrode; growing a crystal of silicon of the layer to the electrode exposed, to form an electrode having protrusions and depressions; and forming another electrode on the electrode with a third insulation film posed therebetween.

In accordance with the present invention initially a silicon nucleus is at least formed and in that condition electrical isolation can be provided and second and first insulation films can be removed to reduce scattering silicon grains and removal of a layer that will serve as an electrode, and thereafter the silicon of the layer that will serve as the electrode that is exposed is further crystallized to provide the electrode with protrusions and depressions to allow the electrode, a third insulation film and another electrode to form a capacitor increased in capacity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

The present method of fabricating a semiconductor device in a first embodiment is employed to fabricate a DRAM, as will be described hereinafter. Initially on a semiconductor substrate 1 a memory cell transistor and the like are formed. Then the memory cell transistor is covered with an interlayer insulation film 2 for example of silicon oxide film. Interlayer insulation film 2 is provided with a contact hole 2*a* exposing the memory cell transistor. (See FIG. 1.)

Figure 1:
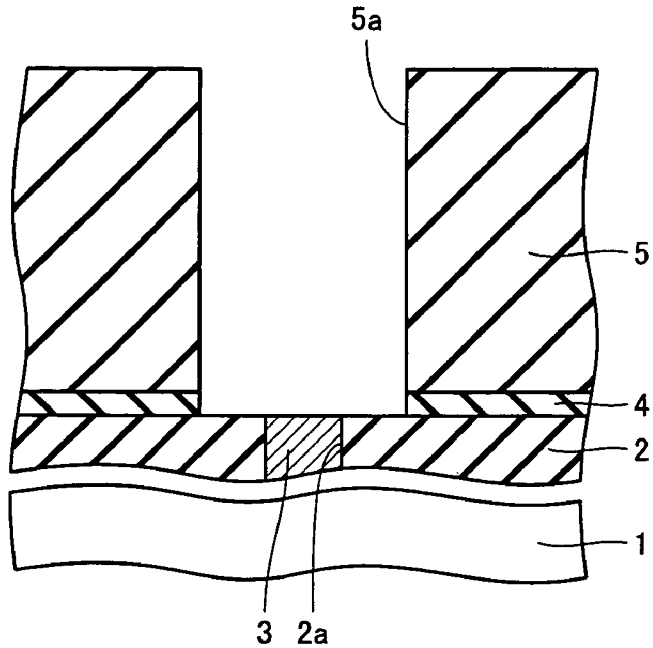
FIG. 1 is a cross section for illustrating a step of a method of fabricating a semiconductor device in accordance with the present invention in a first embodiment.

Subsequently a doped polysilicon film is deposited on interlayer insulation film 2 to fill contact hole 2*a*. The doped polysilicon film has a surface entirely etched back to remove the doped polysilicon film from an upper surface of interlayer insulation film 2 while allowing the doped polysilicon film to remain in the contact hole 2*a*. A bottom electrode plug 3 is thus provided in the contact hole 2*a*, as shown in FIG. 1.

Subsequently a silicon nitride film 4 is deposited on interlayer insulation film 2 as an etching stopper to cover bottom electrode plug 3. On silicon nitride film 4 a silicon oxide film 5 is deposited for providing a storage node.

Subsequently a prescribed resist pattern (not shown) is formed on silicon oxide film 5. The resist pattern is used as a mask to etch silicon oxide film 5 to form an opening 5*a* exposing a surface of bottom electrode plug 3.

Figure 2:
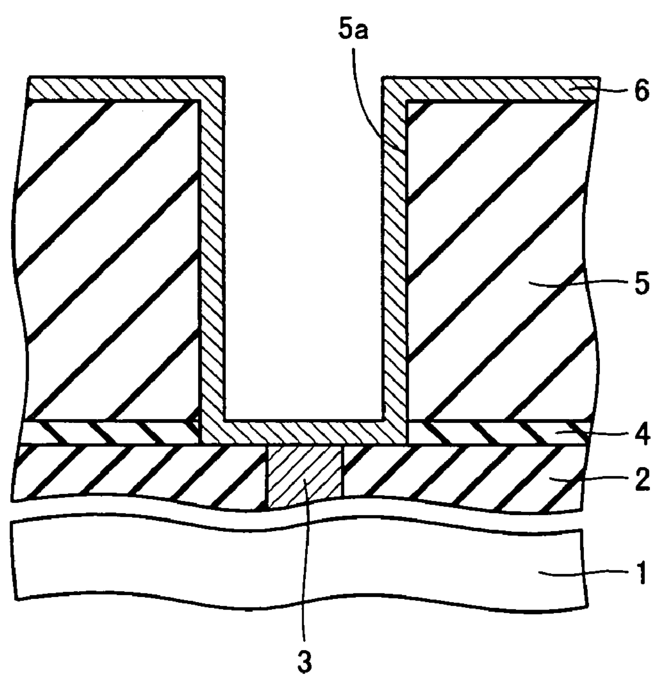
FIGS. 2–6 are cross sections for illustrating steps performed in the first embodiment after the steps shown in FIGS. 1–5, respectively.

Then, as shown in FIG. 2, on silicon oxide film 5 including opening 5*a*, chemical vapor deposition (CVD) is employed to deposit an amorphous silicon film 6 at approximately 500° C. with a doped polysilicon film (not shown) posed therebetween.

Figure 3:
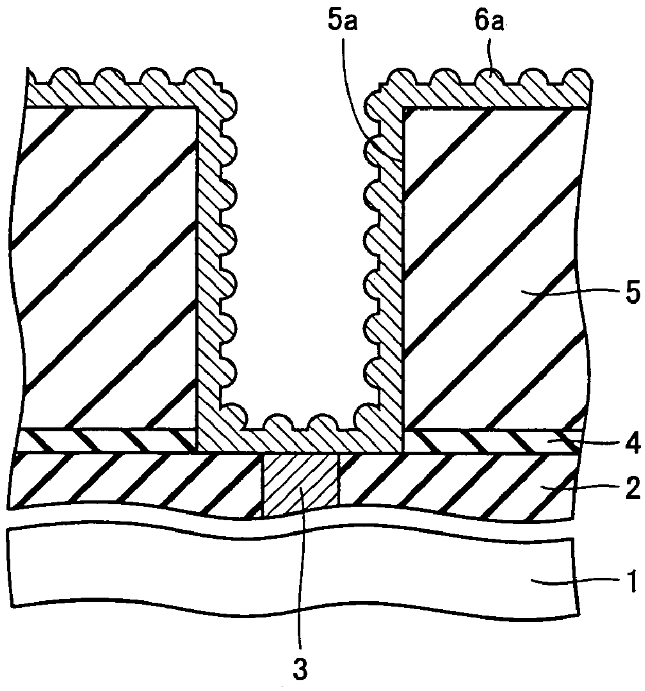

Then amorphous silicon film 6 is roughened for example at 750° C. to 780° C. in an ambient of disilane ($Si_2H_6$) gas to form and grow a silicon nucleus to deposit a semispherical RGP film 6*a*, as shown in FIG. 3.

Figure 4:
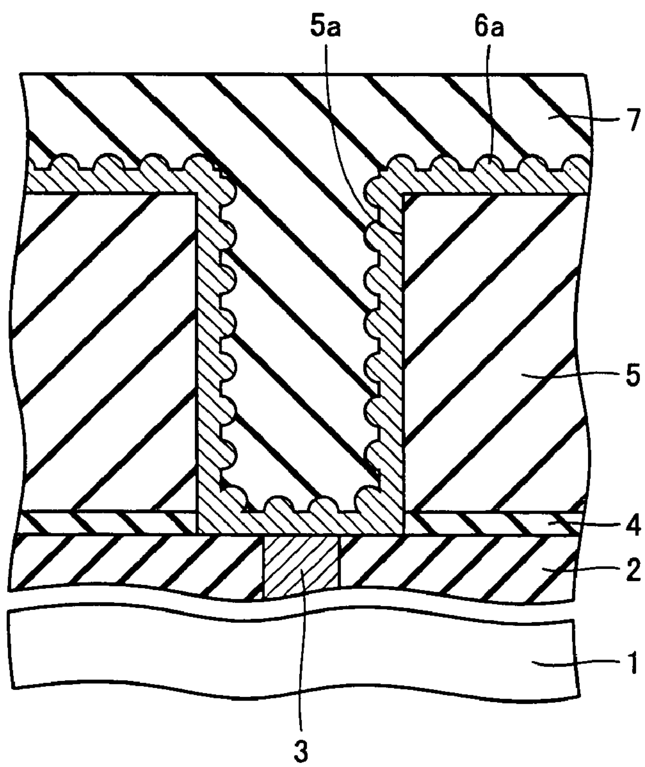

Then, as shown in FIG. 4, CVD is employed to deposit a boro phospo tetra ethyl ortho silicate glass (BPTEOS) film 7 on semispherical RGP film 6*a* to fill opening 5*a*.

Figure 5:
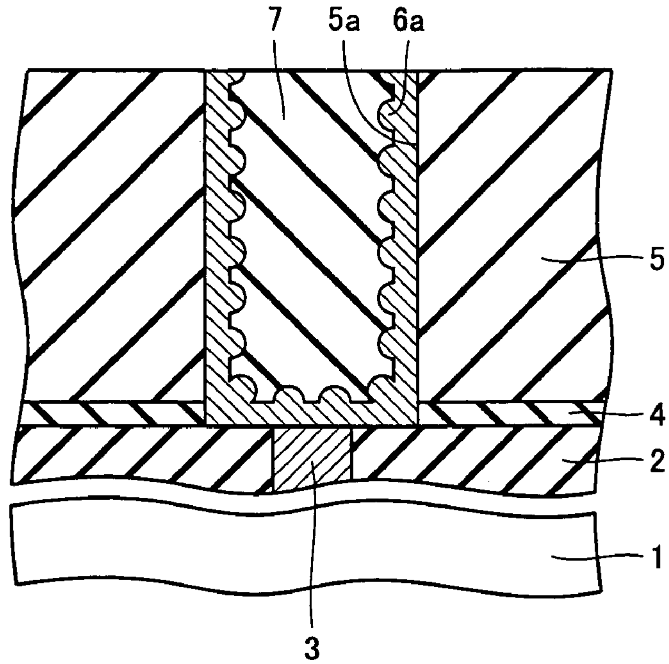

Then, as shown in FIG. 5, a CMP step is performed to remove BPTEOS film 7 and RGP film 6*a* from an upper surface of silicon oxide film 5 while allowing RGP film 6*a* to remain in opening 5*a*. After the CMP step, a prescribed washing step is performed. Electrical isolation from a portion which will serve as an adjacent storage node, is thus achieved.

Figure 6:
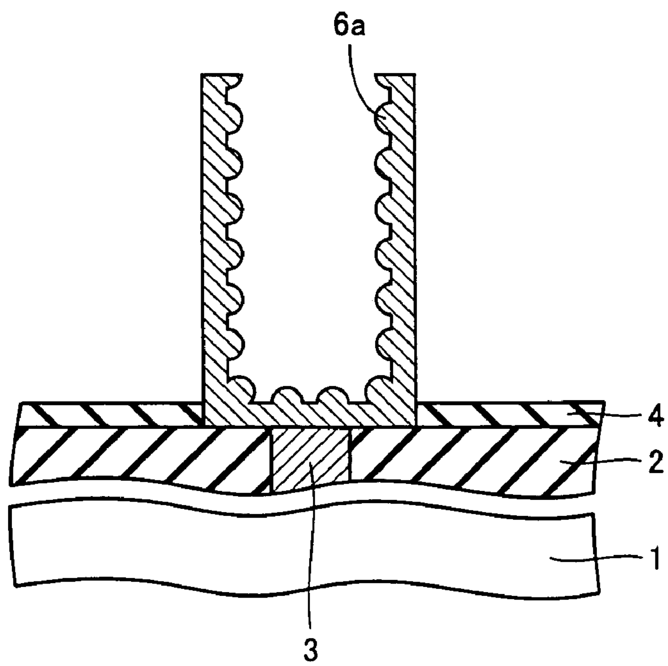
Figure 7:
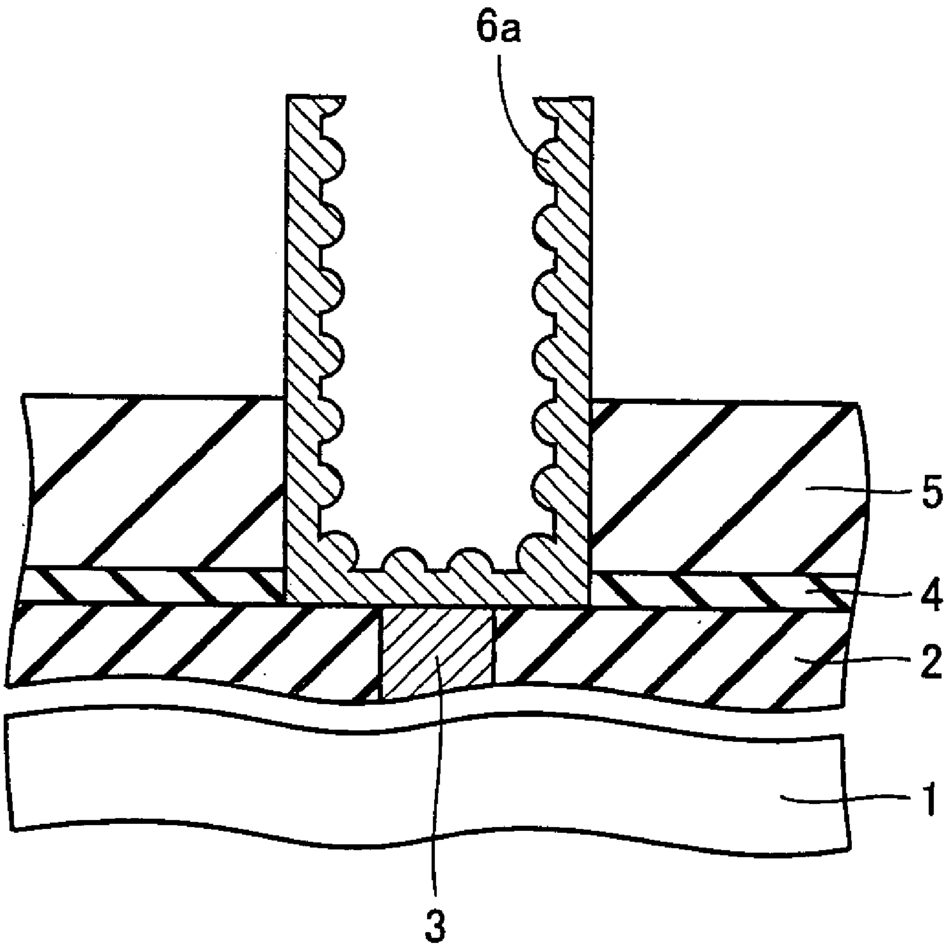
FIG. 7 is a cross section for illustrating a step in an exemplary variation performed in the first embodiment after the FIG. 5 step.

Then a prescribed etching step is performed to remove BPTEOS film 7 deposited on RGP film 6*a* that remains. A further etching step is performed to remove silicon oxide film 5 surrounding RGP film 6*a* that remains, to expose semispherical RGP film 6*a* that will serve as a storage node of a capacitor, as shown in FIG. 6. Note that, as shown in FIG. 7, silicon oxide film 5 may partially be allowed to remain to support RGP film 6*a*.

Figure 8:
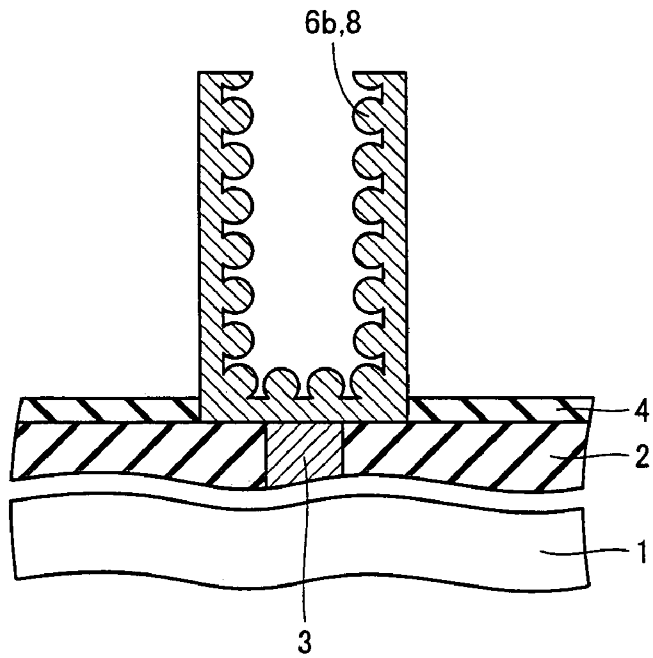
FIGS. 8–11 are cross sections for illustrating steps performed in the first embodiment after the steps shown in FIGS. 6 and 8–10, respectively.

Then, as shown in FIG. 8, an annealing step is performed at approximately 750° C. to 780° C. to further grow semispherical RGP film 6*a*. Semispherical RGP film 6*a* is thus grown to have a geometry closer to a sphere to provide a generally spherical RGP film 6*b*. A storage node 8 is thus formed having a surface with protrusions and depressions resulting from generally spherical RGP film 6*b*.

Figure 9:
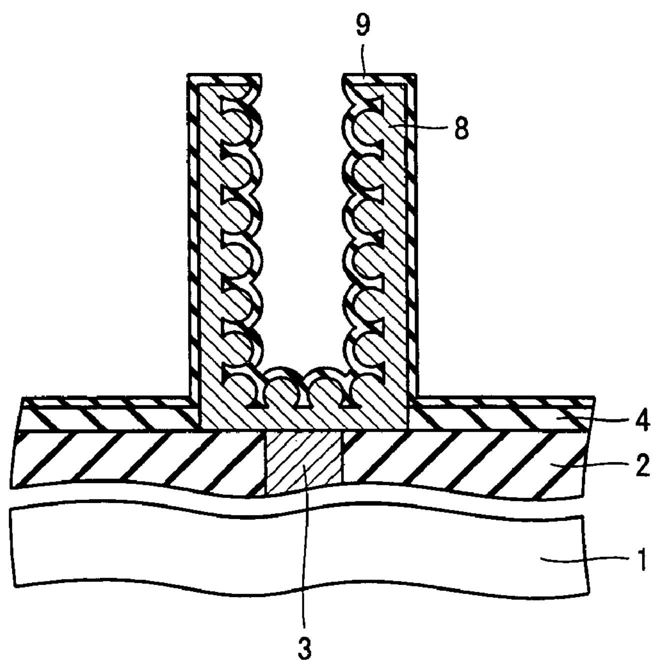
Figure 10:
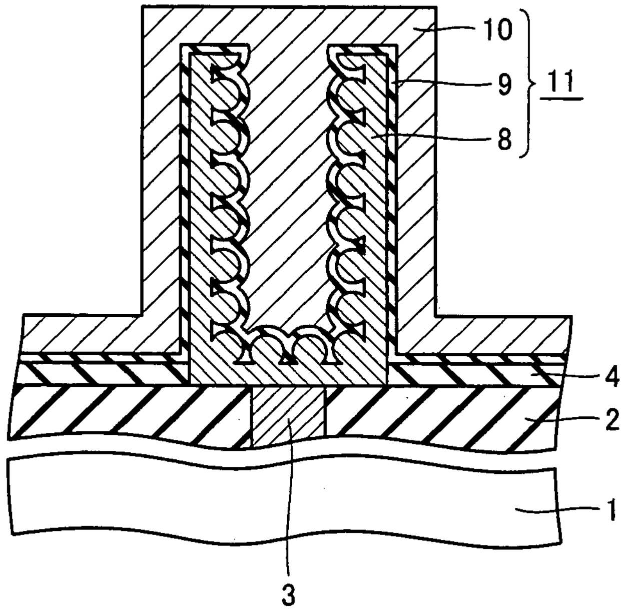

Then, as shown in FIG. 9, CVD is employed to deposit a capacitor insulation film 9 on storage node 8. Then, as shown in FIG. 10, CVD is employed to deposit polysilicon film on capacitor insulation film 9 to form a cell plate 10. A capacitor 11 having storage node 8, capacitor insulation film 9 and cell plate 10 is thus formed.

Figure 11:
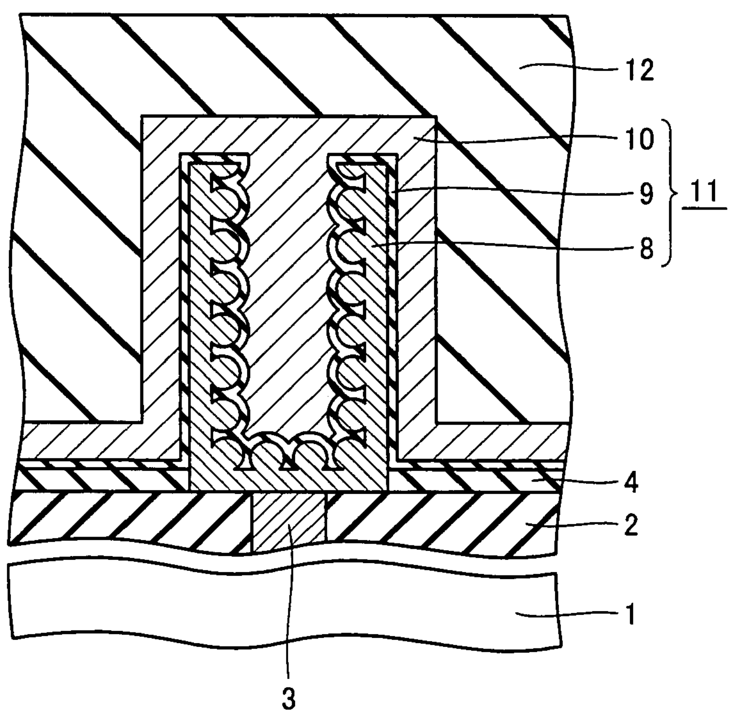

Then, as shown in FIG. 11, CVD is employed to deposit an interlayer insulation film 12 to cover capacitor 11. Subsequently on interlayer insulation film 12 a prescribed metal interconnect (not shown) or the like is arranged to complete a main portion of the DRAM.

In the above described method initially on silicon oxide film 5 including opening 5*a* semispherical RGP film 6*a* is deposited and opening 5*a* is filled with BPTEOS film 7 and thereafter a portion other than semispherical RGP film 6*a* in opening 5*a* is CMPed and thus removed.

Opening 5*a* is filled with BPTEOS film 7 deposited at a relatively low temperature, i.e., a temperature lower than that at which a silicon crystal is grown. This contributes to reduced crystal growth of silicon at semispherical RGP film 6*a* and hence reduced scattering of RGP film 6*a* (silicon grains) when a CMP step is performed. After the CMP step is performed a washing step, an etching step and the like can also be performed with reduced scattering, removal and the like of RGP film 6*a*.

Subsequently, semispherical RGP film 6*a* is annealed to grow a crystal of silicon to provide generally spherical RGP film 6*b* to provide storage node 8 with an increased surface area to allow the capacitor to have increased capacity.

Thus in the present method semispherical RGP film 6*a* can be interrupted from crystallization of silicon while CMP, washing, etching steps and/or the like can be performed so as to reduce scattering, removal and/or the like of RGP film 6*a*. Subsequently, an annealing step can be performed to promote crystallization of silicon of semispherical RGP film 6*a* to provide generally spherical RGP film 6*b* to provide the capacitor with increased capacity.

Second Embodiment

Figure 12:
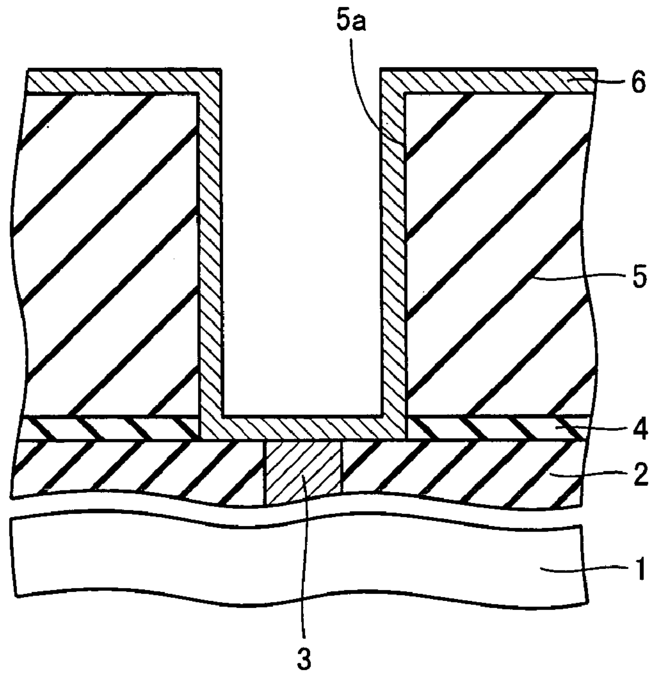
FIG. 12 is a cross section for illustrating a step of the present method in a second embodiment.
Figure 13:
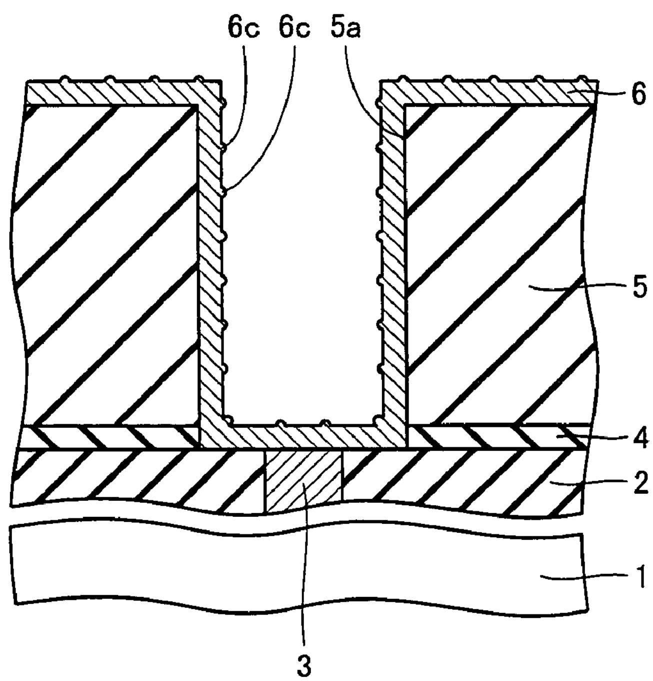
FIGS. 13–20 are cross sections for illustrating steps performed in the second embodiment after the steps shown in FIGS. 12–19, respectively.

The present method in a second embodiment will be described. The process up to FIG. 12 is similar to that up to FIG. 2 as has been described previously. Then, as shown in FIG. 13, amorphous silicon film 6 is annealed in an ambient of disilane ($Si_2H_6$) gas for example at approximately 750° C. to 780° C. to grow a silicon nucleus 6*c*. Note that herein until it becomes a semispherical RGP film silicon crystal growth is not performed.

Figure 14:
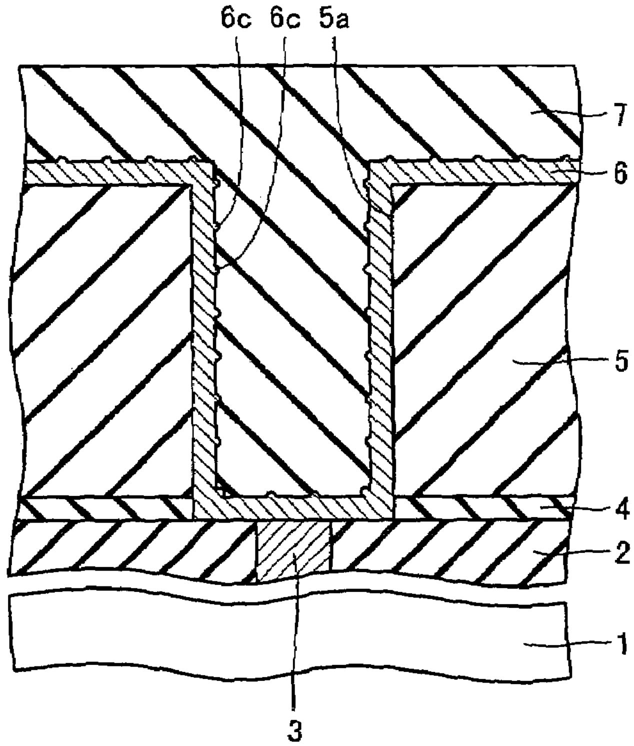
Figure 15:
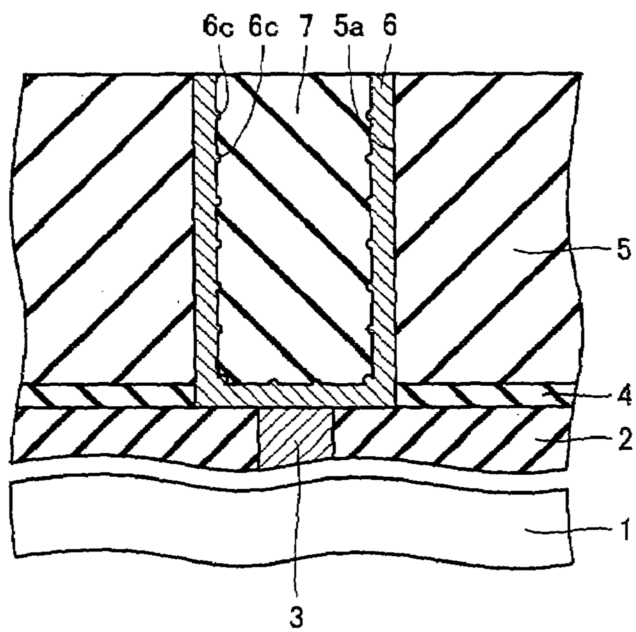

Then, as shown in FIG. 14, BPTEOS film 7 is formed by CVD on the polysilicon film with silicon nucleus 6*c* to fill opening 5*a*. Then, as shown in FIG. 15, a CMP step is performed to remove BPTEOS film 7 and silicon nucleus 6*c* overlying silicon oxide film 5 while allowing silicon nucleus 6*c* to remain in opening 5*a*. After the CMP step a prescribed washing step is performed. Electrical isolation from a portion that will be an adjacent storage node, is thus achieved.

Figure 16:
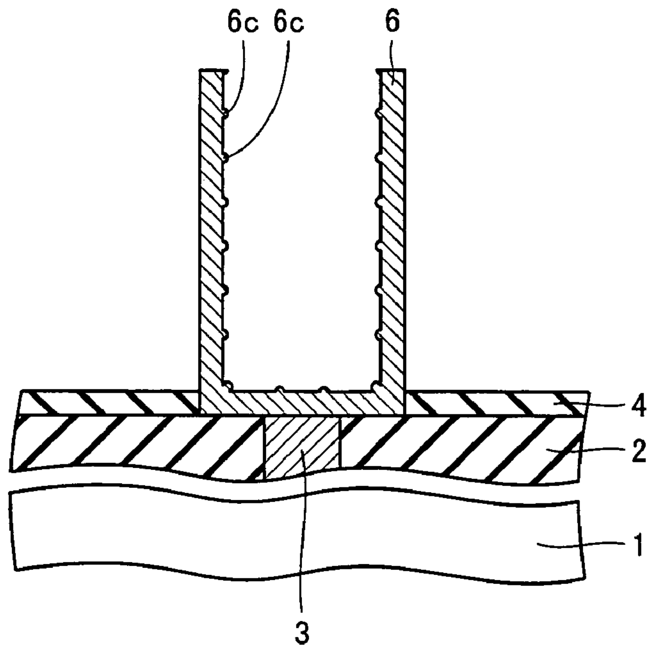

Then a prescribed etching step is performed to remove BPTEOS film 7 overlying the polysilicon film having silicon nucleus 6*c* that remains. A further etching step is performed to remove silicon oxide film 5 surrounding the polysilicon film having silicon nucleus 6*c* that remains, to expose the polysilicon film having silicon nucleus 6*c* that will serve as a storage node of a capacitor, as shown in FIG. 16.

Figure 17:
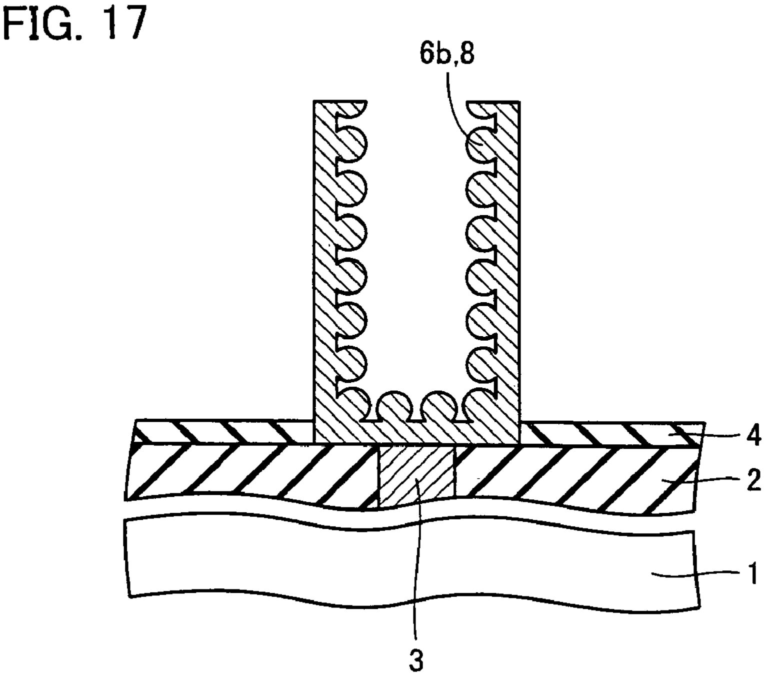

Then, as shown in FIG. 17, an annealing step is performed at approximately 750° C. to 780° C. to grow silicon nucleus 6*c* to form generally spherical RGP film 6*b*. Storage node 8 having a surface with protrusions and depressions provided by generally spherical RGP film 6*b*, is thus formed.

Figure 18:
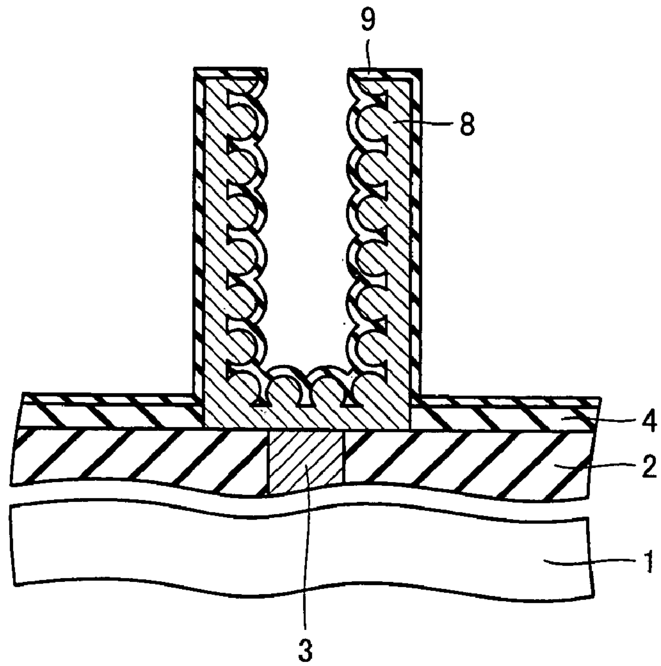
Figure 19:
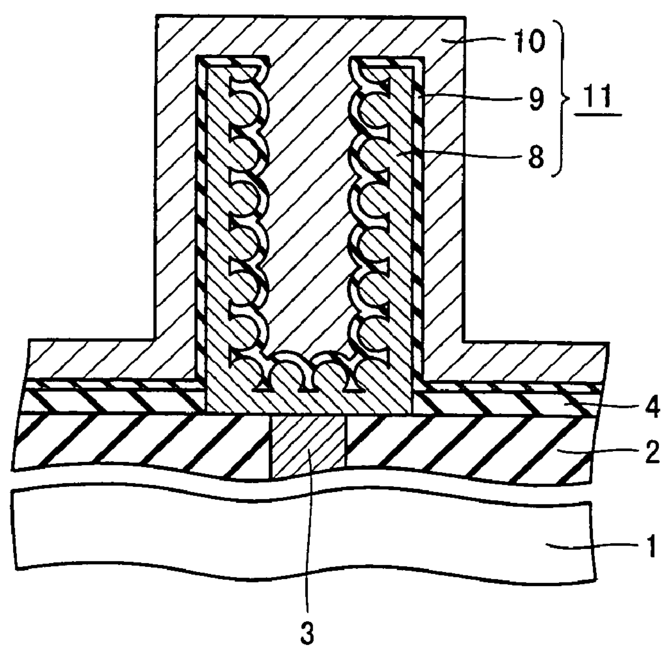

Then, as shown in FIG. 18, CVD is employed to deposit capacitor insulation film 9 on storage node 8. Then, as shown in FIG. 19, CVD is employed to for example deposit a titanium nitride film and a polysilicon film on capacitor insulation film 9 to form cell plate 10. Capacitor 11 having storage node 8, capacitor insulation film 9 and cell plate 10, is thus formed.

Figure 20:
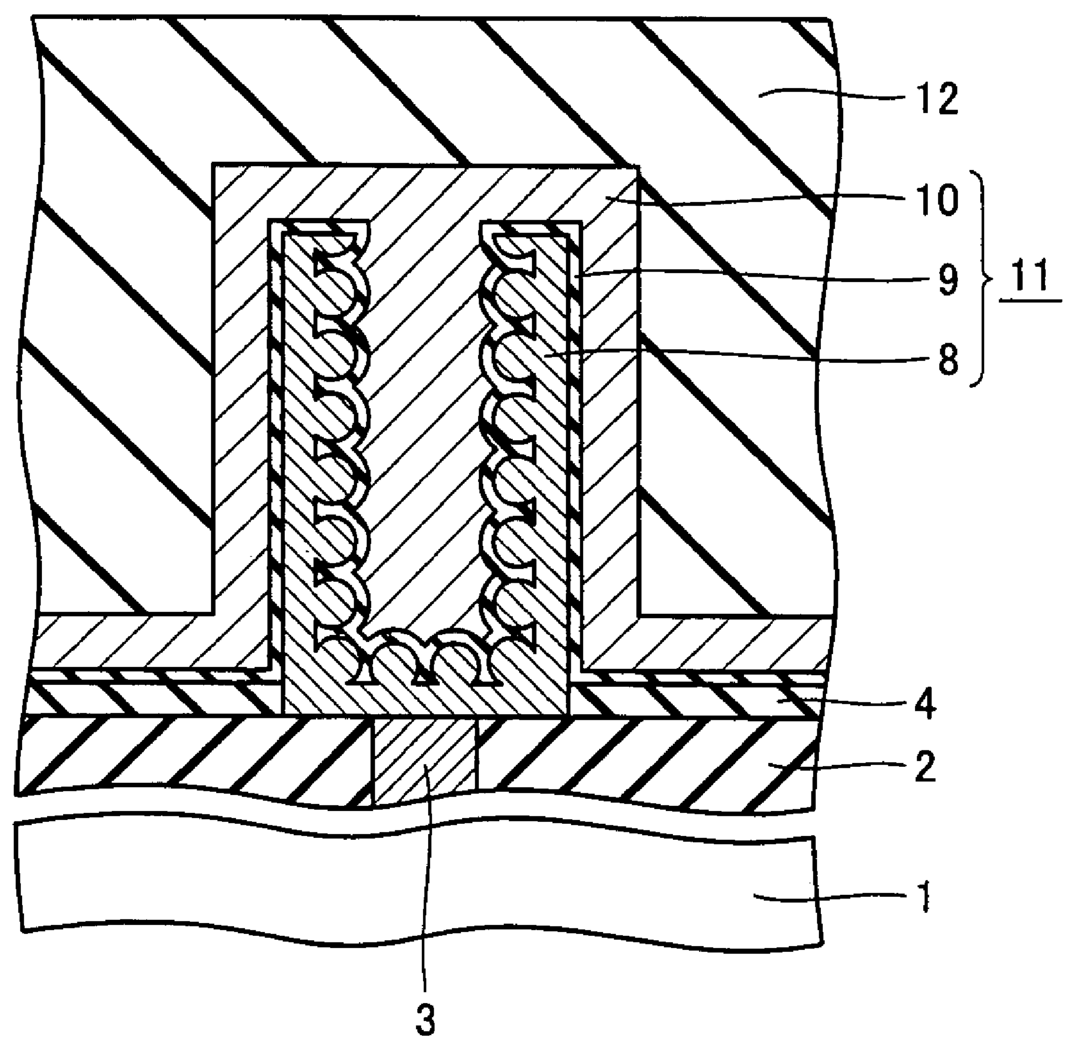

Then, as shown in FIG. 20, CVD is employed to deposit interlayer insulation film 12 to cover capacitor 11. Subsequently on interlayer insulation film 12 a prescribed metal interconnect (not shown) or the like is arranged to complete a main portion of the DRAM.

In the above described method initially on silicon oxide film 5 including the interior of opening 5*a* amorphous silicon 6 is deposited and on a surface thereof silicon nucleus 6*c* is formed. Then opening 5*a* is filled with BPTEOS film 7 and thereafter a portion other than that which is located in opening 5*a* and has silicon nucleus 6*c* is CMPed and thus removed.

Opening 5*a* is filled with BPTEOS film 7 deposited at a relatively low temperature, i.e., a temperature lower than that at which a silicon crystal is grown. This contributes to reduced crystal growth of silicon nucleus 6*c* and hence reduced silicon grains scattering when a CMP step is performed. After the CMP step is performed a washing step, an etching step and the like can also be performed with reduced scattering, removal and the like of silicon grains.

Subsequently, an annealing step is performed to grow silicon nucleus 6*c* to form generally spherical RGP film 6*b* to provide storage node 8 with an increased surface area to allow the capacitor to have increased capacity.

Thus in the present method silicon nucleus 6*c* is formed and in that condition CMP, washing, etching steps and/or the like can be performed so as to reduce scattering, removal and/or the like of silicon grains. Subsequently, an annealing step can be performed to grow silicon nucleus 6*c* to form generally spherical RGP film 6*b* to provide the capacitor with increased capacity.

Note that while in each embodiment described above, opening 5*a* is filled with an insulation film implemented by BPTEOS film 7, it is not limited to BPTEOS film 7 and any insulation film may be used that is formed at a temperature lower than that at which a silicon crystal is grown. For example, it may be a phospho silicate glass (PSG) film doped only with phosphorus, an undoped silicate glass (USG) film, spin on glass (SOG) film, or the like. Furthermore, bottom electrode plug 3 formed in contact hole 2*a* may have a structure electrically connected to a pad electrode formed on a semiconductor substrate.

The present invention is effectively be applied to ensure that a semiconductor device has a capacitor with sufficient capacity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, comprising the steps of:

depositing a first insulation film of a prescribed thickness on a main surface of a semiconductor substrate;

providing said first insulation film with an opening to expose a main surface of said semiconductor substrate;

depositing an amorphous silicon film on a surface of said first insulation film including said opening's bottom and side surfaces;

at least forming a silicon nucleus on a surface of said amorphous silicon film to grow silicon to form a layer to serve as an electrode;

depositing a second insulation film on said layer to serve as said electrode to fill said opening;

removing said layer to serve as said electrode and said second insulation film from an upper surface of said first insulation film to electrically isolate said layer to serve as said electrode;

removing said first and second insulation films to expose said layer to serve as said electrode;

growing a crystal of silicon of said layer to said electrode exposed, to form an electrode having protrusions and depressions; and forming another electrode on said electrode with a third insulation film posed therebetween.

2. The method of claim 1, wherein the step of at least forming includes the step of growing said silicon nucleus formed at said layer to serve as said electrode, to reach a stage of growth intermediate, as prescribed, in a process formed of a series of steps performed to grow a crystal of silicon.

3. The method of claim 2, wherein in the step of depositing said second insulation film, said second insulation film is deposited at a temperature lower than that causing a crystal of silicon to be grown.

4. The method of claim 3, wherein in the step of depositing said second insulation film, said second insulation film is a silicon oxide film having boron and phosphorus added thereto.

5. The method of claim 4, wherein in the step of at least forming, said silicon nucleus is formed by using disilane ($Si_2H_6$) gas.

6. The method of claim 3, wherein in the step of at least forming, said silicon nucleus is formed by using disilane ($Si_2H_6$) gas.

7. The method of claim 2, wherein in the step of depositing said second insulation film, said second insulation film is a silicon oxide film having boron and phosphorus added thereto.

8. The method of claim 7, wherein in the step of at least forming, said silicon nucleus is formed by using disilane ($Si_2H_6$) gas.

9. The method of claim 2, wherein in the step of at least forming, said silicon nucleus is formed by using disilane ($Si_2H_6$) gas.

10. The method of claim 1, wherein in the step of depositing said second insulation film, said second insulation film is deposited at a temperature lower than that causing a crystal of silicon to be grown.

11. The method of claim 10, wherein in the step of depositing said second insulation film, said second insulation film is a silicon oxide film having boron and phosphorus added thereto.

12. The method of claim 11, wherein in the step of at least forming, said silicon nucleus is formed by using disilane ($Si_2H_6$) gas.

13. The method of claim 10, wherein in the step of at least forming, said silicon nucleus is formed by using disilane ($Si_2H_6$) gas.

14. The method of claim 1, wherein in the step of depositing said second insulation film, said second insulation film is a silicon oxide film having boron and phosphorous added thereto.

15. The method of claim 14, wherein in the step of at least forming, said silicon nucleus is formed by using disilane ($Si_2H_6$) gas.

16. The method of claim 1, wherein in the step of at least forming, said silicon nucleus is formed by using disilane ($Si_2H_6$) gas.

* * * * *